(12) United States Patent
Liu

(10) Patent No.: US 8,913,058 B2
(45) Date of Patent: Dec. 16, 2014

(54) DISPLAYING INFORMATION ASSOCIATED WITH AN OBJECT

(75) Inventor: Haiyang Liu, Plumouth, MN (US)

(73) Assignee: Honeywell International Inc., Morristown, NJ (US)

( * ) Notice: Subject to any disclaimer, the term of this patent is extended or adjusted under 35 U.S.C. 154(b) by 403 days.

(21) Appl. No.: 13/351,979

(22) Filed: Jan. 17, 2012

(65) Prior Publication Data

US 2013/0181974 A1    Jul. 18, 2013

(51) Int. Cl.
G06T 15/00    (2011.01)
G06F 17/50    (2006.01)

(52) U.S. Cl.
CPC ..................................... G06F 17/50 (2013.01)
USPC ............ 345/419; 345/420; 345/428; 345/441

(58) Field of Classification Search
CPC ...................................................... G06F 17/50
USPC .................................. 345/419, 420, 428, 441
See application file for complete search history.

(56) References Cited

U.S. PATENT DOCUMENTS

| 5,923,573 A * | 7/1999 | Hatanaka ........................... 703/2 |
| 8,281,297 B2 * | 10/2012 | Dasu et al. ..................... 717/161 |
| 2009/0307255 A1 | 12/2009 | Park |
| 2013/0085588 A1 | 4/2013 | Brun et al. |

FOREIGN PATENT DOCUMENTS

JP    A-9-45048    2/1997

OTHER PUBLICATIONS

Motai et al, An interactive framework for acquiring vision models of 3D objects, IEEE, Feb. 2004, pp. 566-578.*
Oct. 16, 2012 Japanese Office Action issued in Japanese Patent Application No. 2009-159342 (with translation).
Artur Krukowski, et al. Comprehensive Building Information Management System Approach. International Journal of Simulation Systems, Science & Technology, vol. 11, No. 3, pp. 12-28, May 2010.
Andreas Fernbach, et al. Interoperability at the Management Level of Building Automation Systems: A Case Study for BACnet and OPC UA, IEEE ETFA. pp. 1-8. 2011.

* cited by examiner

Primary Examiner — Phu K Nguyen
(74) Attorney, Agent, or Firm — Brooks, Cameron & Huebsch, PLLC

(57) ABSTRACT

Displaying information associated with an object is described herein. One method includes determining attributes associated with an object, visualizing the object using a mobile device, detecting, by the mobile device, the attributes from the visualization, and receiving, by the mobile device, information associated with the object in response to the detection of attributes.

19 Claims, 4 Drawing Sheets

DISPLAYING INFORMATION ASSOCIATED WITH AN OBJECT

TECHNICAL FIELD

The present disclosure relates to displaying information associated with an object.

BACKGROUND

Industrial areas (e.g., buildings and/or plants) can have a number of objects (e.g., equipment and/or devices) associated therewith. Such objects can be a part of a sensing and/or control network, and/or can provide information associated with the operations and/or condition (e.g., status) of equipment in an area, for instance.

Equipment in an industrial area may be approached by a user (e.g., a field technician) for assignments associated with, for example, installation, commissioning, servicing, and/or performance tuning of the equipment. The technician may desire to access digital information from a back-end control center to complete such an assignment.

For example, to service a heating, ventilation, and air conditioning (HVAC) system, a technician may first navigate through a structure to locate the appropriate equipment which may be obstructed by other objects (e.g., a wall, door, and/or ceiling). To complete the assignment, the technician may desire instructions for performing maintenance on the equipment, may desire a number of readings associated with process parameters of the equipment, and/or may desire confirmation of the working status of the equipment, for instance.

Previous approaches for completing such an assignment may include a technician communicating with another user at a back-end control center (e.g., using a mobile phone) or making multiple physical visits to the equipment. Mistakes associated with equipment misidentification and/or changing process parameters can yield inefficiency costs which can further be compounded by operation errors under previous approaches.

DETAILED DESCRIPTION

Figure 1:
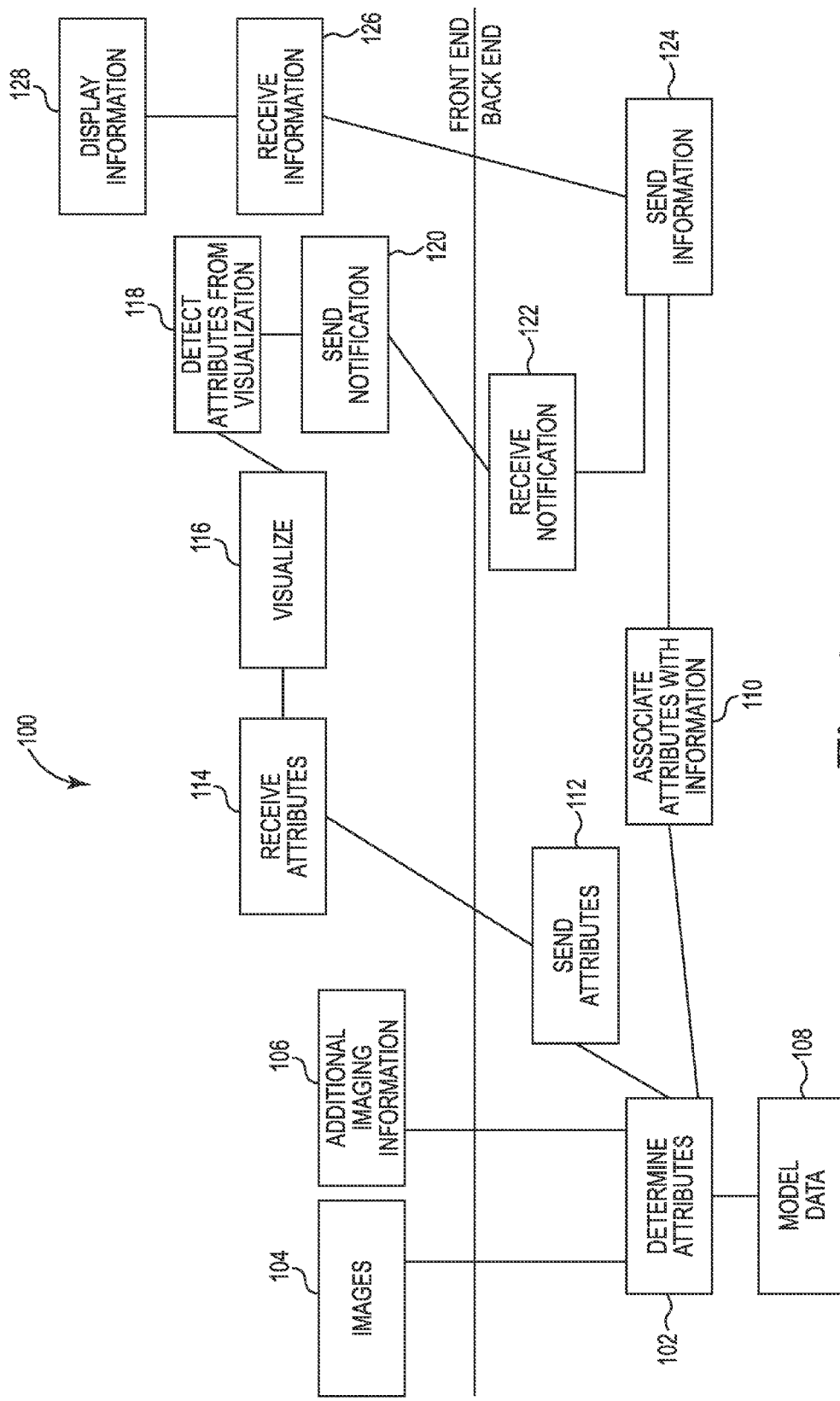
FIG. 1 illustrates a flow chart associated with displaying information associated with an object in accordance with one or more embodiments of the present disclosure.

Displaying information associated with an object is described herein. For example, embodiments include determining attributes associated with an object, visualizing the object using a mobile device, detecting, by the mobile device, the attributes from the visualization, and receiving, by the mobile device, information associated with the object in response to the detection of attributes.

Embodiments of the present disclosure can allow real-time (e.g., immediate) access of digital information associated with various portions of industrial areas. Accordingly, embodiments of the present disclosure can eliminate the need for phone communication between an on-site technician and another technician at a back-end control center. Further, embodiments of the present disclosure can eliminate the need for a technician to make multiple visits to equipment.

Additionally, embodiments of the present disclosure can integrate context-specific information to a smart commercial off-the-shelf handheld device (e.g., a smart phone). Such information can be overlaid onto a display of the device and/or a real-time visualization (e.g., as the visualization is being captured and/or displayed) of an industrial area. Further, embodiments of the present disclosure can be dynamically updated with relevant feature sets based on work assignment.

Additionally, embodiments of the present disclosure can allow a user to obtain physical views (e.g., video streams) of an area, extract live features at frame rate, and compare the features with loaded feature sets without having to transmit the raw video and/or image data to a back-end location for object identification.

In the following detailed description, reference is made to the accompanying drawings that form a part hereof. The drawings show by way of illustration how one or more embodiments of the disclosure may be practiced. These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits. For example, 234 may reference element "34" in FIG. 2, and a similar element may be referenced as 434 in FIG. 4. As used herein, "a" or "a number of" something can refer to one or more such things. For example, "a number of rules" can refer to one or more rules.

FIG. 1 illustrates a flow chart 100 associated with displaying information associated with an object in accordance with one or more embodiments of the present disclosure. Flow chart 100 can be used (e.g., performed by a number of computing devices discussed below) to display information associated with an object in accordance with one or more embodiments of the present disclosure.

As shown in FIG. 1, flow chart 100 can be divided into a front end and a back end. The front end can be associated with (e.g., be performed by) a user device such as a mobile device (e.g., mobile device 230 discussed below in connection with FIG. 2). Mobile devices can include cell phones, personal digital assistants (PDAs), and/or other devices. The back end can be associated with (e.g., be performed by) a system (e.g., a computing system 340 discussed below in connection with FIG. 3) including data management and/or servicing infrastructure, for instance. Devices associated with the front and/or back end can form a network via a number of communicative couplings. A communicative coupling can include wired and/or wireless connections and/or networks such that data can be transferred in any direction between devices associated with the front end and/or back end.

At block 102, attributes associated with an object and/or area can be determined. As used herein, an object (e.g., object 452 discussed below in connection with FIGS. 4A and/or 4B) can include various two or three dimensional objects. An area can include a two or three-dimensional space which can contain a number of objects. By way of example and not limitation, objects can include articles, machines, devices, transmitters, machine-readable codes (e.g., bar codes and/or QR codes) radio-frequency identification (RFID) tags, etc.

Attributes can include visual features (e.g., information associated with an appearance of an object) associated with the object and/or other information. For example, visual features can be determined using images 104 and/or model data 108. Other information used to determine attributes can include additional imaging information 106, for instance.

Visual features can be determined by obtaining (e.g., registering) a number of images 104 of an object and/or multiple objects in an area. For example, a number of images 104 can be captured using an imaging functionality of a mobile device (e.g., imaging functionality 236 of mobile device 230 discussed below in connection with FIG. 2). Images and/or video can be captured via a survey of the object and/or area.

From images 104, a number of visual features associated with the object can be extracted. Visual features can, for example, include interest points such as edges, lines, sharp turns, highlight points, corners, gradients of light density change, etc. and/or relationships between the points, among other features. Storing such visual features on the front end rather than images 104 themselves can allow for the utilization of less space in memory (e.g., memory 238 of mobile device 230 and/or memory 344 of computing device 340), for instance.

Images 104 can be communicated from the front end to the back end (e.g., from mobile device 230 to computing device 340) with additional imaging information 106. Additional imaging information 106 can include a location (e.g., geographic location) of a mobile device (e.g., device 230) at time of image capture, view angle, other device(s) in range of the mobile device, etc., for instance.

Alternatively and/or in addition to images 104 and/or additional imaging information 106, determining attributes 102 can include using model data 108. Model data 108 can include models (e.g., building and/or plant models), and/or object specification data (e.g., known dimensions and/or location of objects) among other information. Building and/or plant models can be received from a number of various Building Information Modeling (BIM) technology sources (e.g., databases), for instance. Object specification data can be received from a manual associated with an object, for example.

Subsequent to their determination at block 102, the attributes can be associated (e.g., correlated) with information associated with the object and/or area (e.g., contextual information). Information associated with the object and/or area can include, for example, equipment lists, operating conditions (e.g. statuses), records associated with the object (e.g., historical service records), building geometries, and/or location data. Such information can be stored via a computing device associated with the back end (e.g., computing device 340) and/or received from an external source. Subsequent to its association with the attributes, information associated with the object and/or area can be communicated to the front end (discussed below).

At block 112 and block 114, respectively, determined attributes can be sent to, and/or received by, the front end (e.g., mobile device 230). For example, determined attributes can be sent and received as a software application and/or module to mobile device 230. The communication of attributes can be based on a work assignment of a user associated with mobile device 230. For example, if a user is undertaking an inspection of a particular portion of an industrial plant (e.g., a wing of the plant), attributes associated with objects and/or areas within that portion can be communicated to mobile device 230. Only communicating the attributes to those associated with a work assignment can reduce the amount of data communicated between the back end and the front end and save time associated with that communication, for instance. Additionally, the attributes (e.g., a portion of the attributes) can be updated based on a change of a work assignment and the updated attributes can be communicated to mobile device 230.

At block 116, mobile device 230 can visualize an object and/or area using an imaging functionality (e.g., imaging functionality 236 discussed below in connection with FIG. 2) of mobile device 230. Imaging functionality 236 can include a video capture functionality of mobile device 230, for example. Imaging functionality 236 can allow a user to visualize (e.g., capture images and/or video in real-time) the object and/or area via a display (e.g., display 234 and/or 434) of mobile device 230.

At block 118, mobile device 230 can detect the determined attributes from the visualization. Detection can include recognition (e.g., in real-time) by mobile device 230 of a number of the visual features and/or relationships between visual features. Additionally and/or alternatively, detection can include using additional imaging information 106 and/or model data 108. For example, a number of visual features can be detected from the visualization and can be combined with received BIM data and/or a location of the mobile device 230 at the time of visualization to yield a detection of the attributes associated with the object and/or area by mobile device 230.

Detection can include applying a threshold correlation (e.g., threshold of similarity) between the features visualized and the features received from the back end. For example, the determined attributes may not be detected unless the visualized attributes exceed a threshold level of similarity to the received attributes. Such a threshold can be created and/or modified by a user and/or by a controller 232 of mobile device 230, discussed below.

Subsequent to the attributes being detected by mobile device 230, mobile device 230 can send a notification (e.g., query) at block 120 which can be received at the back end at block 122. Such a notification can be associated with a request for information previously associated with (e.g., correlated with) the attributes subsequent to their determination at the back end. The information can then be sent at block 124 from the back end and received at the front end (e.g., received in real-time) at block 126.

Once received, the information associated with the object and/or area can be displayed at block 128 on a display (e.g., on display 234 and/or 434) of mobile device 230. Displaying 128 can include displaying the information via text, images, and/or graphical representations, among other methods. Further, displaying 128 can include displaying the information in an overlay of the visualization of the object and/or area. An example of such a display is illustrated in FIG. 4, discussed below.

Additionally and/or alternatively, displaying can include displaying three-dimensional renderings of additional objects (e.g., objects not visible to the naked eye, such as hidden and/or not yet installed objects). For example, upon visualizing an air conditioning unit via mobile device 230, portions of the air conditioning unit residing behind a wall can be graphically depicted in an overlay as they would appear without the wall. In effect, a visualization can be augmented with the information associated with the object and/or area. Other methods of displaying the information associated with the object and/or area can include, for example, providing documents including the information, opening a window containing the information, and/or providing hyperlinks for accessing the information.

Figure 2:
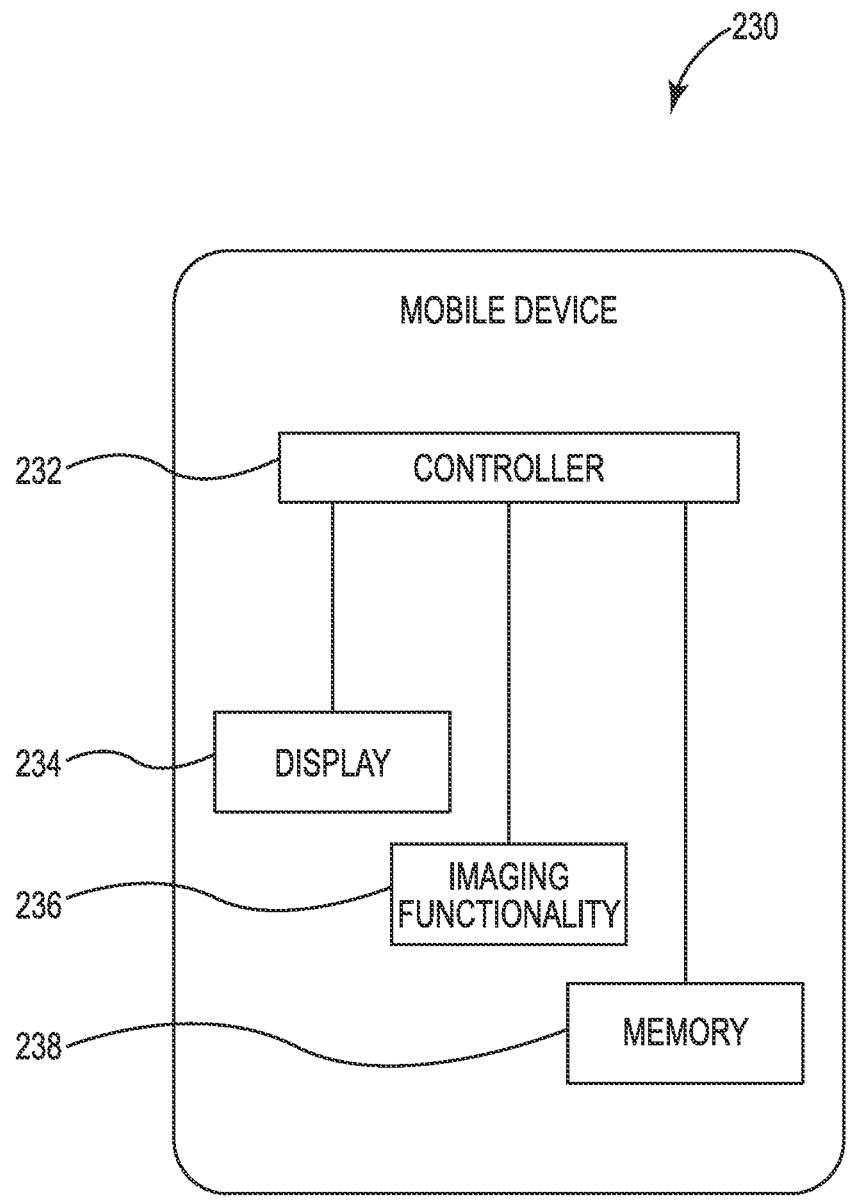
FIG. 2 illustrates a mobile device for displaying information associated with an object in accordance with one or more embodiments of the present disclosure.

FIG. 2 illustrates a mobile device 230 for displaying information associated with an object in accordance with one or more embodiments of the present disclosure. Mobile device 230 can be associated with the front end of flow chart 100 previously described in connection with FIG. 1.

As shown in FIG. 2, mobile device 230 includes a controller 232 (e.g., a processor and/or other control circuitry) coupled to a display 234, an imaging functionality 236, and a memory 238. Display 234 can be a liquid crystal display, or any other type of display commonly used in mobile devices (e.g., a screen). Display 234 can be touch-sensitive, and can act as an input device, for instance. Imaging functionality 236 can be a camera or any other type of imaging functionality used in mobile devices. For example, imaging functionality 236 can be a camera capable of capturing still and/or video images.

Memory 238 can be volatile or nonvolatile memory. Memory 238 can also be removable (e.g., portable) memory, or non-removable (e.g., internal) memory. For example, memory 238 can be random access memory (RAM) (e.g., dynamic random access memory (DRAM), and/or phase change random access memory (PCRAM)), read-only memory (ROM) (e.g., electrically erasable programmable read-only memory (EEPROM), and/or compact-disk read-only memory (CD-ROM)), flash memory, a laser disk, a digital versatile disk (DVD), and/or other optical disk storage), and/or a magnetic medium such as magnetic cassettes, tapes, or disks, among other types of memory.

Further, although memory 238 is illustrated as being located in mobile device 230, embodiments of the present disclosure are not so limited. For example, memory 238 can also be located internal to another computing resource, e.g., enabling computer readable instructions to be downloaded over the Internet or another wired or wireless connection.

Memory 238 can store executable instructions, such as, for example, computer readable instructions (e.g., software), for displaying information associated with an object in accordance with one or more embodiments of the present disclosure. Additionally, and as previously discussed, memory 238 can store, for example, determined attributes associated with objects and/or areas, among other data items.

Figure 3:
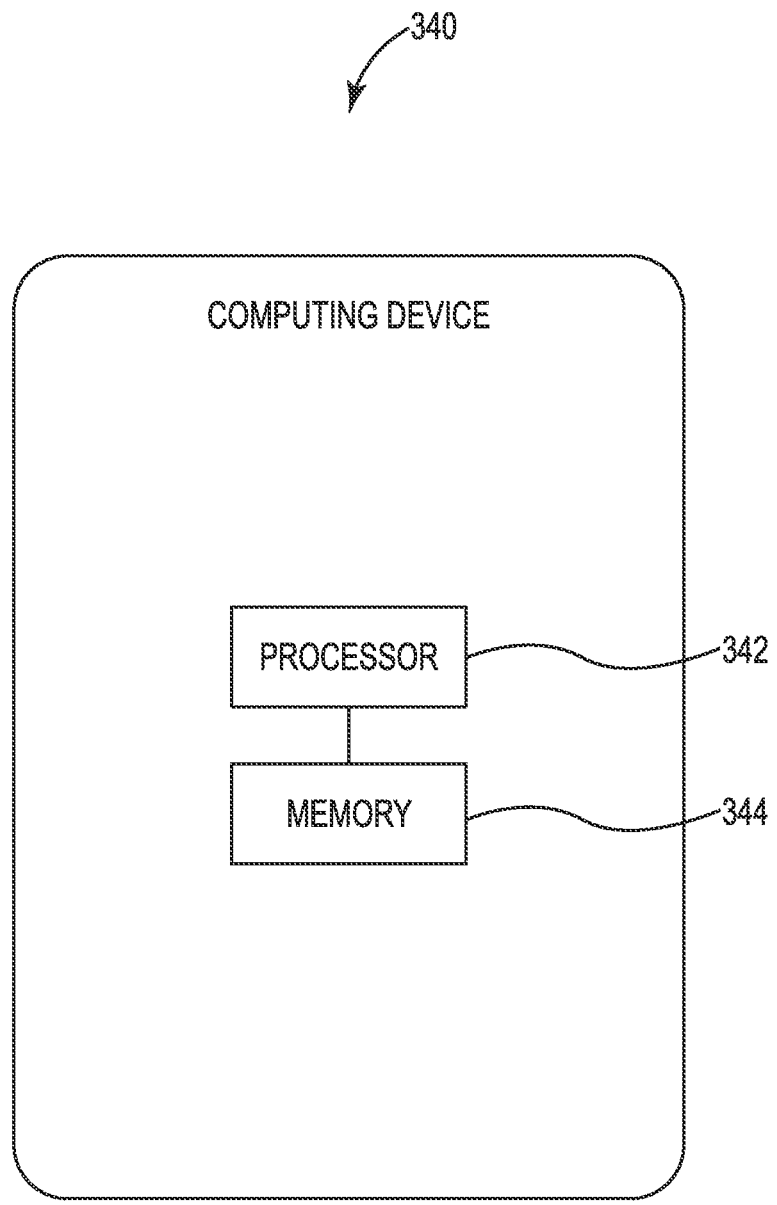
FIG. 3 illustrates a computing device for use in displaying information associated with an object in accordance with one or more embodiments of the present disclosure.

The controller 232 can include, for example, a number of components in the form of hardware and/or firmware (e.g., one or more integrated circuits) and/or software for relaying a video image of an object captured by the imaging functionality 236 to the display 234, associating a set of visual features stored in the memory 238 with a portion of the displayed video image while the video image is being relayed, and relaying information associated with the object from a remote system (e.g., computing device 340 discussed below in connection with FIG. 3) to the display 234 in response to the association.

FIG. 3 illustrates a computing device 340 for displaying information associated with an object in accordance with one or more embodiments of the present disclosure. Computing device 340 can be associated with the back end of flow chart 100 previously discussed in connection with FIG. 1. Although one computing device is shown, embodiments of the present disclosure are not limited to a particular number of computing devices.

Computing device 340 includes a processor 342 and a memory 344. Memory 344 can be analogous to memory 238 previously discussed in FIG. 2. Processor 342 can be analogous to controller 232, previously discussed in connection with FIG. 2, for instance. As shown in FIG. 3, memory 344 can be coupled to processor 342.

Memory 344 can store executable instructions, such as, for example, computer readable instructions (e.g., software), for displaying information associated with an object in accordance with one or more embodiments of the present disclosure. For example, memory 344 can store executable instructions to receive a set of features associated with an appearance of an object, correlate the set of features with information associated with the object, communicate a portion of the set of features to a mobile device (e.g., mobile device 230), receive, from the mobile device, a notification associated with a visual detection, made by the mobile device, of the portion of the set of features, and/or communicate the information associated with the object to the mobile device in response to the notification. Additionally, and as previously discussed, memory 344 can store, for example, information associated with objects and/or areas, among other data items.

Processor 342 can execute the executable instructions stored in memory 344 to communicate information associated with an object in accordance with one or more embodiments of the present disclosure. For example, processor 342 can execute the executable instructions stored in memory 344 to receive a set of features associated with an appearance of an object, correlate the set of features with information associated with the object, communicate a portion of the set of features to a mobile device, receive, from the mobile device, a notification associated with a visual detection, made by the mobile device, of the portion of the set of features, and/or communicate the information associated with the object to the mobile device in response to the notification.

Figure 4A:
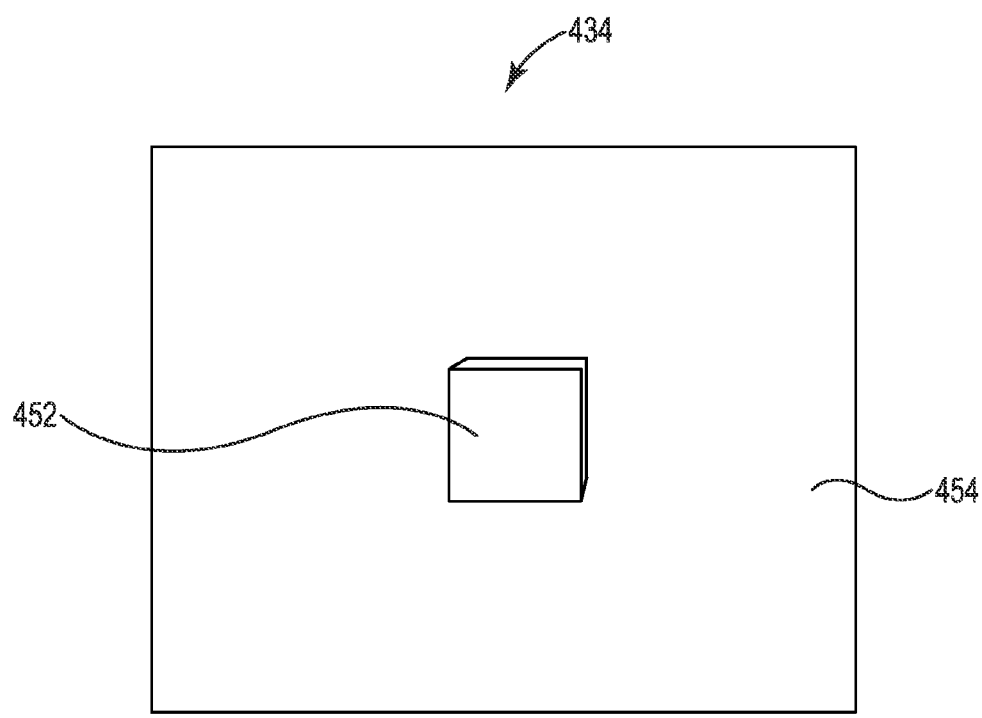
FIGS. 4A and 4B illustrate an example display for displaying information associated with an object in accordance with one or more embodiments of the present disclosure.
Figure 4B:
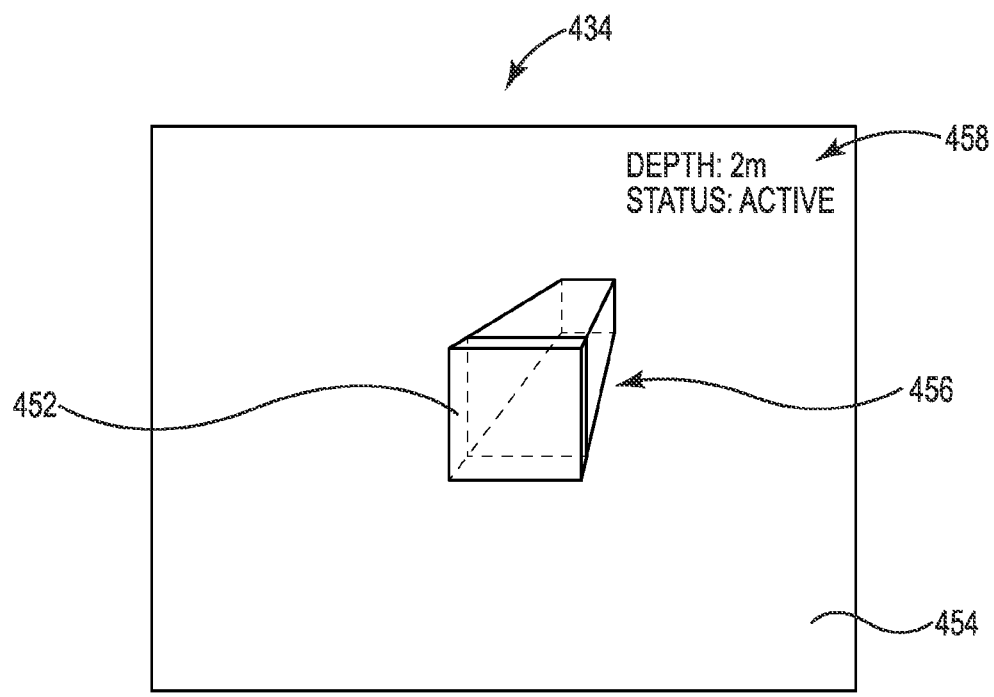

FIGS. 4A and 4B illustrate an example display 434 in accordance with one or more embodiments of the present disclosure. FIG. 4A illustrates a visualization on the display 434 of an object 452 protruding from a wall 454 (e.g., a wall of an industrial plant).

FIG. 4B illustrates display 434 after information associated with object 452 has been received from the back end system (e.g., computing device 340 previously discussed in connection with FIGS. 1 and/or 3). Display of information associated with the object 452 can be performed, for example, in a manner analogous to that previously discussed in connection with FIG. 1. As shown in FIG. 4B, a three-dimensional overlay 456 can be displayed to augment a visualization of object 452. As shown in the embodiment illustrated in FIG. 4B, such an overlay can include a hidden portion of object 442 (e.g., a portion behind wall 454), among other information.

Display 434 can display information associated with object 452 from various viewpoints. For example, an overhead view of the object 452 and/or area can be displayed via display 434, among other viewpoints.

Additionally and/or alternatively, information associated with object 452 can include text 458 associated with object 452. As shown in the embodiment illustrated in FIG. 4B, text 458 can include dimensional information (e.g., an indication that object 452 is 2 meters into wall 454) and/or an operational status of object 452 (e.g., active), among other information.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for displaying information associated with an object, comprising:
    determining respective attributes associated with each of a plurality of objects;
    transmitting the respective attributes associated with a subset of the plurality of objects to a mobile device, wherein the subset of the plurality of objects is determined by a computing device based, at least in part, on a preference of a user associated with the mobile device;
    visualizing an object of the subset using the mobile device;
    detecting, by the mobile device, the attributes associated with the object of the subset from the visualization; and
    receiving, by the mobile device, information associated with the object of the subset in response to the detection of the attributes associated with the object of the subset.

2. The method of claim 1, wherein the method includes determining the respective attributes associated with each of the plurality of objects based, at least in part, on a video survey of each of the plurality of objects.

3. The method of claim 1, wherein the respective attributes include visual features associated with each of the plurality of objects.

4. The method of claim 1, wherein the respective attributes include a location of the mobile device while each of the plurality of objects is being visualized.

5. The method of claim 1, wherein the respective attributes include information received from a building information modeling database.

6. The method of claim 1, wherein the object of the subset is a three-dimensional object.

7. The method of claim 1, wherein the object of the subset is a machine-readable code.

8. The method of claim 1, wherein the method includes displaying the visualized object and the information associated with the object of the subset on a display of the mobile device.

9. The method of claim 1, wherein detecting the set of attributes associated with the object of the subset from the visualization includes determining that the set of visualized attributes exceeds a threshold correlation with the determined set of attributes.

10. A device for displaying information associated with an object, comprising:
    a display;
    an imaging functionality;
    a memory; and
    a controller coupled to the display, the memory, and the imaging functionality, and configured to:
        relay a video image of an object captured by the imaging functionality to the display;
        associate a set of visual features stored in the memory with a portion of the displayed video image while the video image is being relayed, wherein the set of visual features is determined by a computing device and transmitted to the device bases, at least in part, on a preference of a user associated with the device; and
        relay information associated with the object from a remote system to the display in response to the association.

11. The device of claim 10, wherein the display is configured to display a portion of the information associated with the object in a three-dimensional graphical representation.

12. The device of claim 10, wherein the display is configured to display a portion of the information associated with the object textually.

13. The device of claim 10, wherein the display is configured to display the object and a portion of the information associated with the object in an overhead view.

14. The device of claim 10, wherein the controller is configured to overlay a portion of the displayed video image with the information associated with the object.

15. A computing device for use in displaying information associated with an object, comprising:
    a memory; and
    a processor configured to execute instructions stored on the memory to:
        receive a set of features associated with an appearance of an object;
        correlate the set of features with information associated with the object;
        transmit a portion of the set of features to a mobile device, wherein the portion of the set of features is determine based, at least in part, on a preference of a user associated with the mobile device;
        receive, from the mobile device, a notification associated with a visual detection, made by the mobile device, of the portion of the set of features; and
        communicate the information associated with the object to the mobile device in response to the notification.

16. The device of claim 15, wherein the information associated with the object includes an operational status of the object.

17. The device of claim 15, wherein the set of features includes an edge of the object.

18. The device of claim 15, wherein the processor is configured to execute instructions to receive the set of features from the mobile device.

19. The device of claim 15, wherein the processor is configured to execute instructions to:
    update the portion of the set of features based on a change in a work assignment of a user associated with the mobile device; and communicate the updated portion of the set of features to the mobile device.

* * * * *